US009306542B2

(12) United States Patent
Mikhemar et al.

(10) Patent No.: US 9,306,542 B2
(45) Date of Patent: *Apr. 5, 2016

(54) RF FRONT-END WITH ON-CHIP TRANSMITTER/RECEIVER ISOLATION USING A GYRATOR

(71) Applicant: Broadcom Corporation, Irvine, CA (US)

(72) Inventors: Mohyee Mikhemar, Aliso Viejo, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 278 days.

This patent is subject to a terminal disclaimer.

(21) Appl. No.: 13/930,812

(22) Filed: Jun. 28, 2013

(65) Prior Publication Data
US 2013/0285764 A1 Oct. 31, 2013

Related U.S. Application Data

(63) Continuation of application No. 12/727,309, filed on Mar. 19, 2010, now Pat. No. 8,514,035.

(60) Provisional application No. 61/291,152, filed on Dec. 30, 2009.

(51) Int. Cl.
*H03H 11/42* (2006.01)
*H03H 7/46* (2006.01)
*H04B 5/00* (2006.01)

(52) U.S. Cl.
CPC .............. *H03H 11/42* (2013.01); *H04B 5/0093* (2013.01)

(58) Field of Classification Search
CPC ...................................................... H03H 11/42
USPC ......................... 333/213–217; 455/73, 78, 84
See application file for complete search history.

(56) References Cited

U.S. PATENT DOCUMENTS

| | | |
|---|---|---|
| 3,047,821 A | 7/1962 | Hilbinger |
| 3,340,463 A | 9/1967 | Oka |
| 4,051,475 A | 9/1977 | Campbell |
| 4,278,980 A | 7/1981 | Ogita et al. |
| 4,616,188 A | 10/1986 | Stitt et al. |
| 6,480,553 B1 | 11/2002 | Ho et al. |

(Continued)

OTHER PUBLICATIONS

Mikhemar et al., "A Tunable Integrated Duplexer with 50dB Isolation in 40nm CMOS," International Solid-States Circuit Conference, Session 22, PA and Antenna Interface, 22. 7, pp. 386-388, Feb. 11, 2009.

(Continued)

*Primary Examiner* — Dean Takaoka
*Assistant Examiner* — Alan Wong
(74) *Attorney, Agent, or Firm* — Sterne, Kessler, Goldstein & Fox P.L.L.C.

(57) ABSTRACT

An RF front-end with on-chip transmitter/receiver isolation using a gyrator is presented herein. The RF front end is configured to support full-duplex communication and includes a gyrator and a transformer. The gyrator includes two transistors that are configured to isolate the input of a low-noise amplifier (LNA) from the output of a power amplifier (PA). The gyrator is further configured to isolate the output of the PA from the input of the LNA. The gyrator is at least partially or fully capable of being integrated on silicon-based substrate.

20 Claims, 5 Drawing Sheets

(56) References Cited

U.S. PATENT DOCUMENTS

| | | | |
|---|---|---|---|
| 6,490,706 B2 * | 12/2002 | Mattisson | 716/100 |
| 6,577,212 B1 | 6/2003 | Mattisson et al. | |
| 6,721,544 B1 | 4/2004 | Franca-Neto | |
| 6,784,759 B2 * | 8/2004 | Maekawa et al. | 333/132 |
| 7,042,208 B1 | 5/2006 | Harris | |
| 7,065,327 B1 | 6/2006 | Macnally et al. | |
| 7,167,688 B2 | 1/2007 | Li et al. | |
| 7,460,662 B2 | 12/2008 | Pagnanelli | |
| 7,489,914 B2 | 2/2009 | Govind et al. | |
| 7,515,879 B2 | 4/2009 | Okabe et al. | |
| 7,801,493 B2 | 9/2010 | Do | |
| 7,839,938 B2 | 11/2010 | Hershbarger | |
| 7,844,231 B2 | 11/2010 | Yoon | |
| 8,130,054 B1 | 3/2012 | Martin et al. | |
| 8,208,865 B2 | 6/2012 | Mikhemar et al. | |
| 8,208,866 B2 * | 6/2012 | Mikhemar | H04B 1/18 455/550.1 |
| 8,249,536 B2 | 8/2012 | Jung et al. | |
| 8,502,626 B2 * | 8/2013 | Mikhemar | H04B 5/0093 333/215 |
| 8,514,035 B2 * | 8/2013 | Mikhemar et al. | 333/215 |
| 2003/0095421 A1 | 5/2003 | Kadatskyy et al. | |
| 2004/0092285 A1 | 5/2004 | Kodim | |
| 2004/0095277 A1 | 5/2004 | Mohamadi | |
| 2004/0145411 A1 | 7/2004 | Harvey | |
| 2007/0117524 A1 | 5/2007 | Do | |
| 2007/0152904 A1 | 7/2007 | Castaneda et al. | |
| 2007/0207747 A1 | 9/2007 | Johnson et al. | |
| 2008/0139149 A1 | 6/2008 | Mu et al. | |
| 2010/0035563 A1 | 2/2010 | Mikhemar et al. | |
| 2010/0157858 A1 | 6/2010 | Lee et al. | |
| 2010/0210223 A1 | 8/2010 | Gorbachov | |
| 2011/0064004 A1 | 3/2011 | Mikhemar et al. | |
| 2011/0064005 A1 | 3/2011 | Mikhemar et al. | |
| 2011/0158134 A1 | 6/2011 | Mikhemar et al. | |
| 2011/0158135 A1 | 6/2011 | Mikhemar et al. | |

OTHER PUBLICATIONS

Sartori, "Hybrid Transformers," IEEE Transactions on Parts, Materials and Packaging, vol. PMP-4, No. 3, pp. 59-66, Sep. 1968.

U.S. Appl. No. 12/363,486, filed Jan. 30, 2009, entitled "RF Transceiver Front-End with RX/TX Isolation."

* cited by examiner

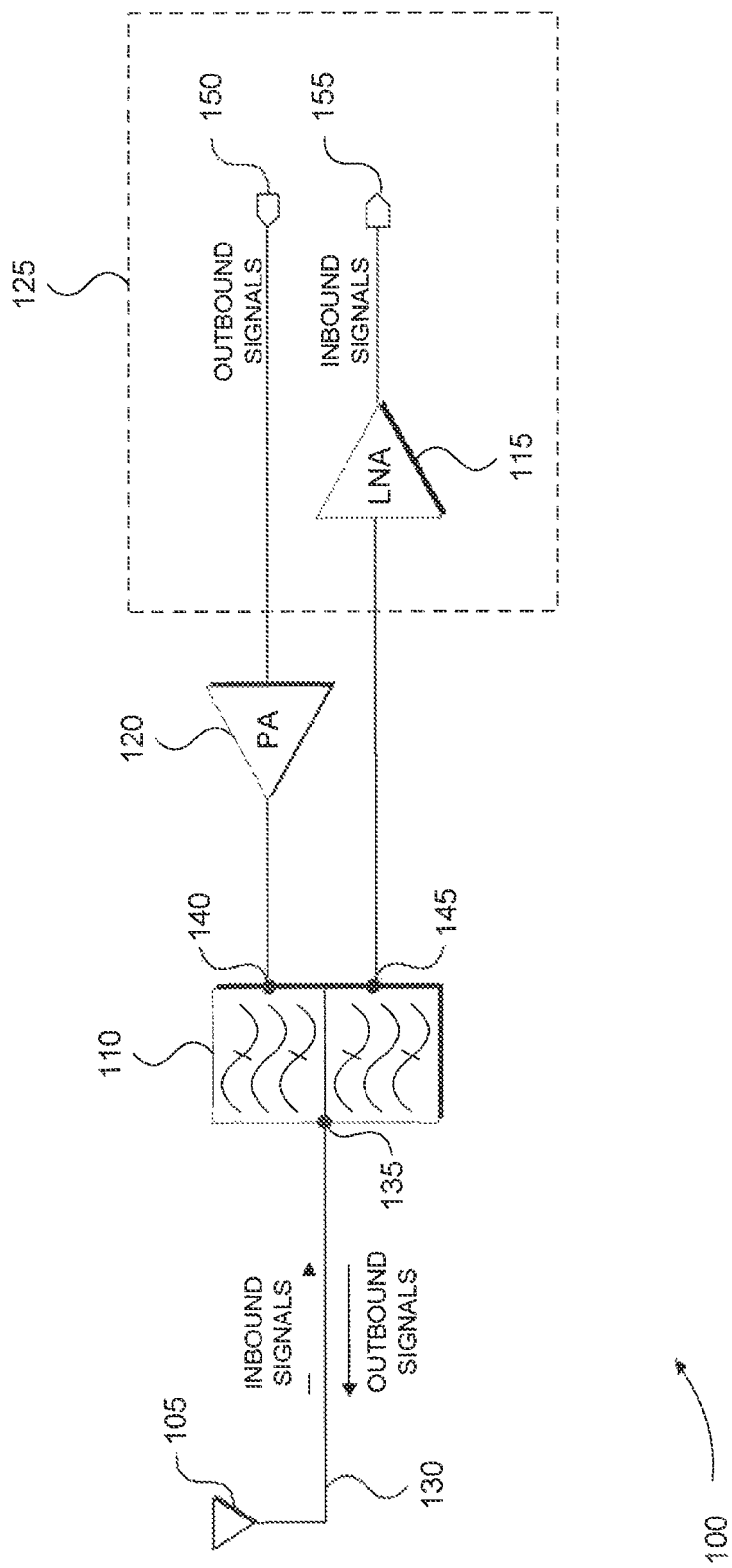
FIG. 1 (Isolation by Frequency Selection - Conventional)

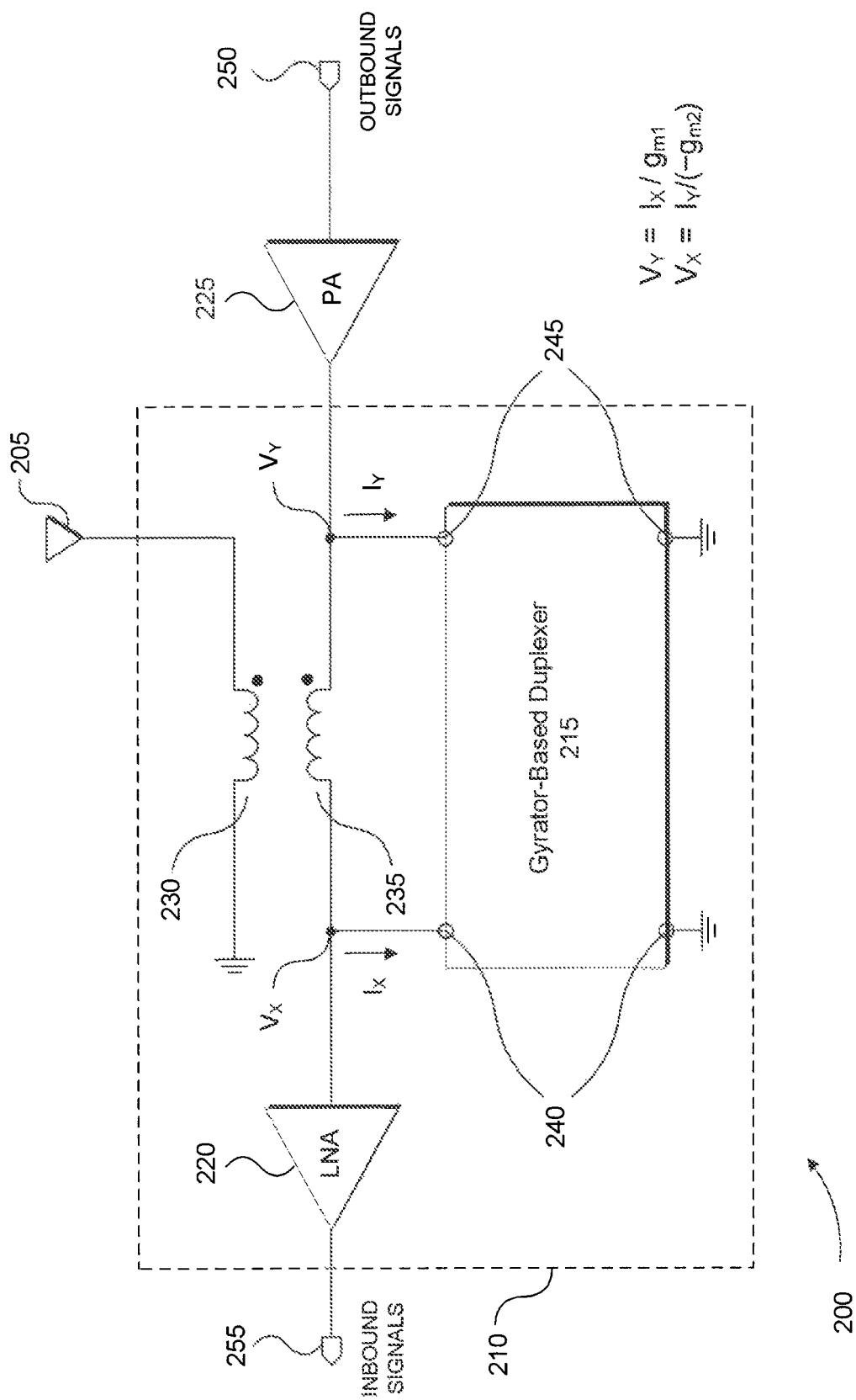
FIG. 2 (Isolation by Gyrator)

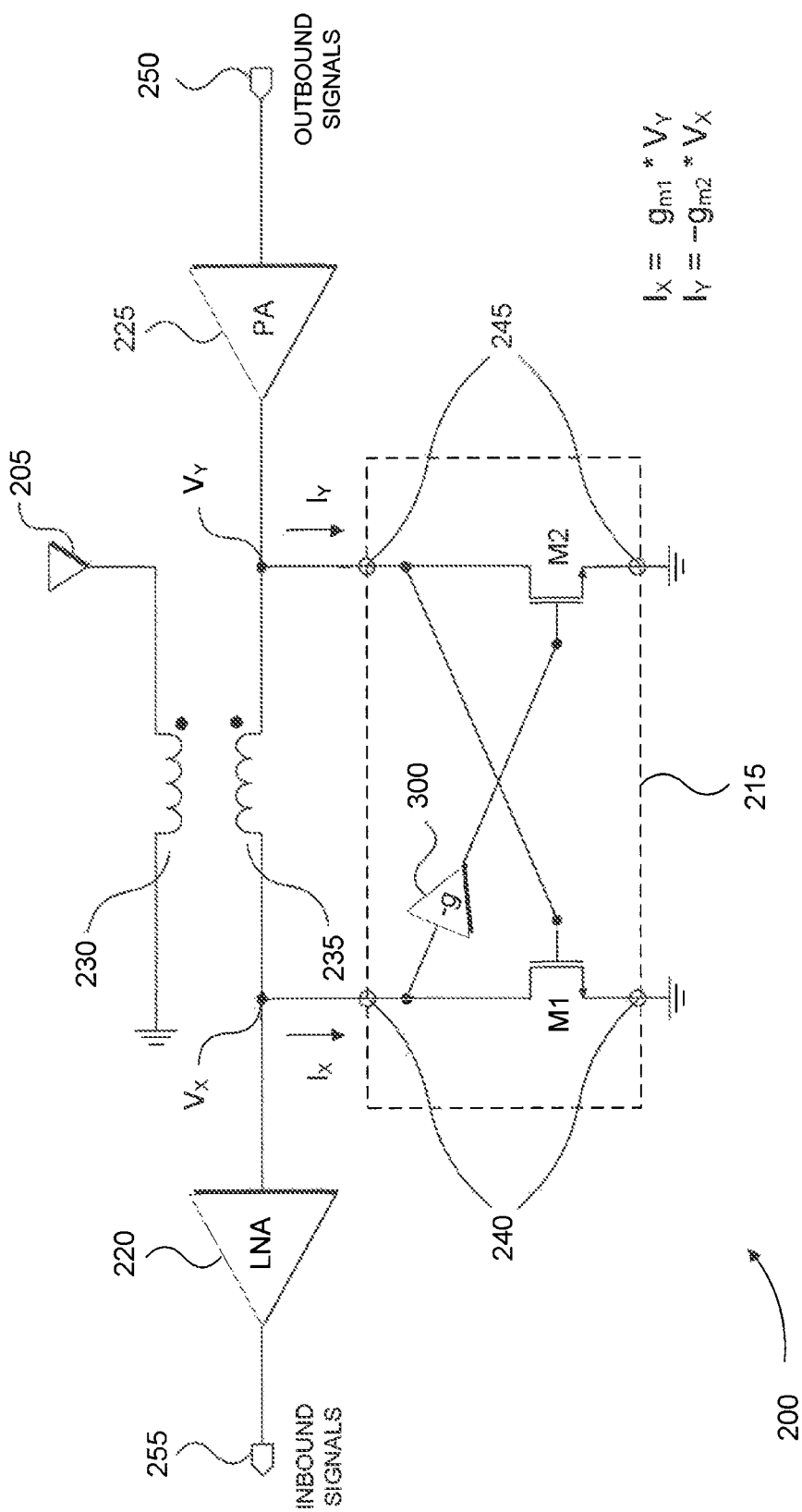
FIG. 3 (Isolation by Gyrator)

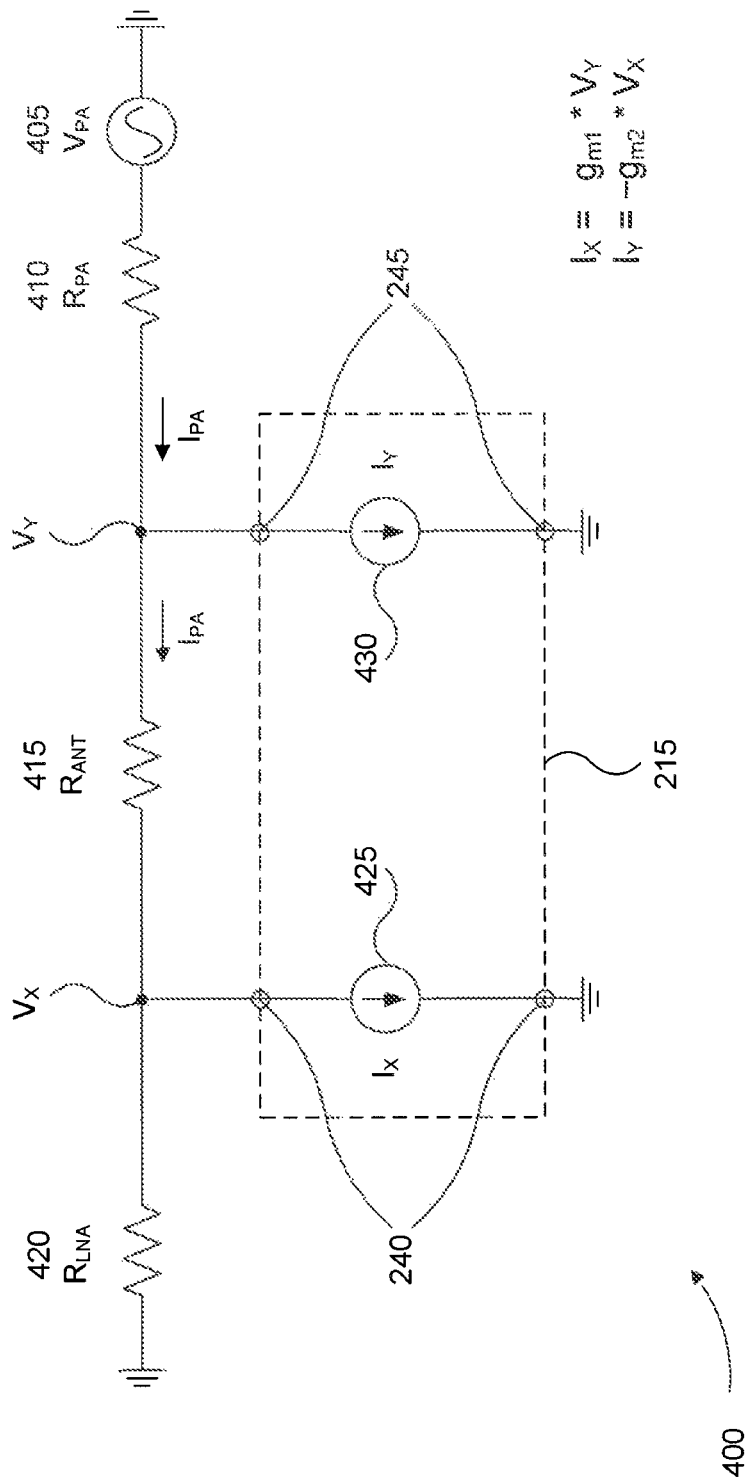
FIG. 4 (Isolation by Gyrator: Transmission)

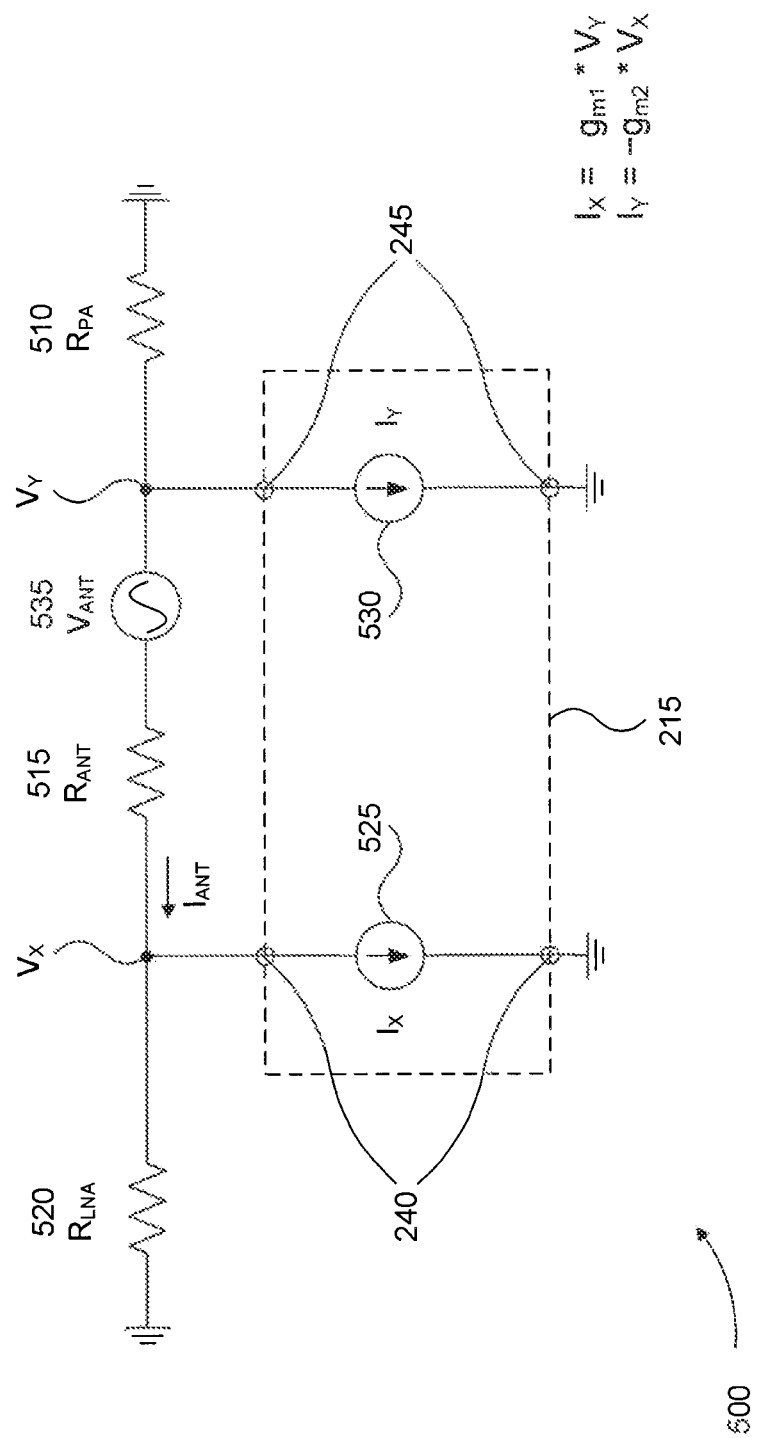
FIG. 5 (Isolation by Gyrator: Reception)

US 9,306,542 B2

RF FRONT-END WITH ON-CHIP TRANSMITTER/RECEIVER ISOLATION USING A GYRATOR

CROSS REFERENCE TO RELATED APPLICATIONS

This patent application is a continuation of U.S. patent application Ser. No. 12/727,309, filed Mar. 19, 2010, which claims the benefit of U.S. Provisional Patent Application No. 61/291,152, filed Dec. 30, 2009, all of which are incorporated herein by reference in their entireties.

FIELD OF THE INVENTION

This application relates generally to wireless communication systems, and more particularly to full-duplex radio frequency (RF) transceivers that operate in such systems.

BACKGROUND

A duplex communication system includes two interconnected transceivers that communicate with each other in both directions. There are multiple types of duplex communication systems; including, half-duplex communication systems and full-duplex communication systems. In a half-duplex communication system, the two interconnected transceivers communicate with each other in both directions. However, the communication in a half-duplex system is limited to one direction at a time; that is, only one of the two interconnected transceivers transmits at any given point in time, while the other receives. A full-duplex communication system, on the other hand, does not have such a limitation. Rather, in a full-duplex communication system, the two interconnected transceivers can communicate with each other simultaneously in both directions.

Wireless and/or mobile communication systems are often full-duplex as specified by the standard(s) that they employ. For example, a common full duplex mobile communication standard includes Universal Mobile Telecommunications System (UMTS). In these full-duplex communication systems, the transmitter typically uses one carrier frequency in a given frequency band (e.g., 900 MHz, 1800 MHz, 1900 MHz, 2100 MHz, etc.) and the receiver uses a different carrier frequency in the same frequency band. This scheme, where the transmitter and receiver operate over different frequencies, is referred to as frequency division duplexing (FDD).

Despite using different frequencies, the signal strength of the transmitted signal is often significantly greater than that of the received signal (e.g., by as much as 130 dB) at the transceiver. As such, the receiver is susceptible to interference from the transmitted signal. In order to limit the interference, conventional transceivers include a duplexer, which utilizes frequency selectivity to provide 50-60 dB of isolation between the transmitter and the receiver. However, to provide for today's high frequency communication standards, duplexers should be built with high quality factor (Q-factor) and low loss materials, which currently cannot be done using silicon-based technology. As such, duplexers are fabricated using special materials and processes (e.g., ceramic, surface acoustic wave (SAW), film bulk acoustic wave (FBAR), etc.) that cannot be integrated with a transceiver on a silicon-based IC.

More recent implementations of full-duplex wireless transceivers operate over multiple frequency bands (e.g., there are 14 frequency bands for FDD-UMTS), which require a separate duplexer for each band in order to meet the isolation requirement. As each duplexer is off-chip (i.e., not integrated with the transceiver on the silicon based IC), the monetary cost and size for multi-band transceivers can become substantial.

Therefore, a need exists for a duplexer functional circuit that can be fabricated using silicon-based technology such that it can be implemented on the same integrated circuit as the transceiver.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 illustrates a block diagram of an RF front-end that provides isolation by frequency selection.

FIG. 2 illustrates a block diagram of an RF front-end that provides isolation using a gyrator, according to embodiments of the present invention.

FIG. 3 illustrates a schematic diagram of a gyrator, according to embodiments of the present invention.

FIG. 4 illustrates a behavioral model of the RF front-end illustrated in FIGS. 2 and 3, where superposition is used to analyze the RF front-end during transmission of a signal, according to embodiments of the present invention.

FIG. 5 illustrates a behavioral model of the RF front-end illustrated in FIGS. 2 and 3, where superposition is used to analyze the RF front-end during reception of a signal, according to embodiments of the present invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

1. ISOLATION BY FREQUENCY SELECTION

FIG. 1 illustrates a block diagram of an RF front-end 100 configured to provide full-duplex communication. RF front-end 100 includes an antenna 105, a duplexer 110, a low-noise amplifier (LNA) 115, a power amplifier (PA) 120, and an integrated-circuit (IC) 125. RF front-end 100 can be used within a cellular telephone, a laptop computer, a wireless local area network (WLAN) station, and/or any other device that transmits and receives RF signals.

In operation, RF front-end 100 transmits and receives RF signals over non-overlapping portions of a particular frequency band (e.g., one of the 14 bands specified by FDD-UMTS, including the 900 MHz, 1800 MHz, and 2100 MHz bands). By transmitting and receiving signals over non-overlapping portions of a particular frequency band, the two signals do not interfere with each other and full-duplex communication can be achieved. For example, as illustrated in FIG. 1, both inbound and outbound signals are simultaneously coupled between antenna 105 and duplexer 110 over a common signal path 130. In such an arrangement, duplexer 110 is used to couple common signal path 130 to both the input of LNA 115 and to the output of PA 120. Duplexer 110 provides the necessary coupling, while preventing strong outbound signals, produced by PA 120, from being coupled to the input of LNA 115.

As illustrated in FIG. 1, duplexer 110 is a three-port device having an antenna port 135, a transmit port 140, and a receive port 145. Antenna port 135 is coupled to transmit port 140 through a transmit band-pass filter, included in duplexer 110, and to receive port 145 through a receive band-pass filter, further included in duplexer 110. The pass band of the transmit filter is centered within the frequency range of the outbound signals, which are received at node 150 from a transmitter (not shown). The pass band of the receive filter is centered within the frequency range of the inbound signals, which are passed to a receiver (not shown) at node 155. The transmit and receive band-pass filters are configured such that their respective stop bands overlap with each others pass bands. In this way, the band-pass filters isolate the input of LNA 115 from the strong outbound signals produced by PA 120. In typical implementations, duplexer 110 must attenuate the strong outbound signals by about 50-60 dB to prevent the outbound signals from saturating LNA 115.

Today's high frequency communication standards (e.g., FDD-UMTS) require that conventional frequency selective duplexers, such as duplexer 110, be built with very high Q-factor and low loss materials, which currently cannot be done using silicon-based technology. As such, conventional duplexers are fabricated using special materials and processes (e.g., ceramic, surface acoustic wave (SAW), film bulk acoustic wave (FBAR), etc.) that cannot be integrated with a transceiver on a silicon-based IC. In an embodiment, IC 125 is implemented using silicon-based technology and includes at least portions of LNA 115, the transmitter (not shown) coupled at node 150, and the receiver (not shown) coupled at node 155. Because conventional duplexer 110 typically cannot be integrated on IC 125, due to the limitations of silicon-based technology, duplexer 110 is provided for off-chip, thereby increasing the size and cost of the radio transceiver.

In addition, more recent implementations of full-duplex radio transceivers operate over multiple frequency bands (e.g., there are 14 frequency bands for FDD-UMTS), which require a separate conventional duplexer 110 for each band. In these multi-band transceivers, each duplexer is off-chip, significantly increasing the size and cost of the radio transceiver.

Therefore, a need exists for a duplexer functional circuit that can be fabricated using silicon-based technology such that it can be implemented on the same integrated circuit as the radio transceiver.

2. ISOLATION BY GYRATOR 2.1 Overview

FIG. 2 illustrates a block diagram of an RF front-end 200 configured to provide full-duplex communication, according to embodiments of the present invention. Unlike RF front-end 100, illustrated in FIG. 1, which provides isolation using frequency selection, RF front-end 200 provides isolation using an electrical approach. Specifically, as will be explained further below, RF front-end 200 provides isolation using a gyrator-based duplexer.

RF front-end 200 includes an antenna 205 (e.g., a signal transducer), an IC 210, a gyrator 215, an LNA 220, a PA 225, and a transformer that includes a primary winding 230 and a secondary winding 235. In an embodiment, IC 210 is implemented using a silicon-based technology and includes at least portions of LNA 220, transformer windings 230 and 235, gyrator 215, a transmitter (not shown) coupled at node 250, and a receiver (not shown) coupled at node 255. RF front-end 200 can be used within a cellular telephone, a laptop computer, a wireless local area network (WLAN) station, and/or any other device that transmits and receives RF signals.

In operation, RF front-end 200 transmits and receives RF signals over overlapping or non-overlapping portions of at least one particular frequency band (e.g., one of the 14 bands specified by FDD-UMTS, including the 900 MHz, 1800 MHz, and 2100 MHz bands).

During reception, antenna 205 receives electromagnetic waves and converts the electromagnetic waves into a modulated, electrical current that flows through winding 230. The varying current in winding 230 induces a voltage across winding 235 that is sensed at the input of LNA 220 and provided to a receiver at output node 255 of LNA 220.

During transmission, PA 225 receives a modulated, outbound signal at input node 250, and produces an amplified version of the modulated, outbound signal. Specifically, PA 225 provides a modulated voltage at its output that leads to a current flowing through winding 235, which in turn induces a voltage in winding 230. Because antenna 205 represents a load coupled to winding 230, current will flow from winding 230 to antenna 205, where it will be converted to an electromagnetic wave and transmitted.

Gyrator 215 is configured to prevent strong, outbound signals produced by PA 225 from saturating the input of LNA 220. Gyrator 215 is a four-terminal, two-port network which can be defined by the following equations:

$$V_X = I_Y \cdot \frac{1}{-g_{m2}} \quad (1)$$

$$V_Y = I_X \cdot \frac{1}{g_{m1}} \quad (2)$$

where $I_X$ is the current into and $V_X$ is the voltage across the two terminals constituting a first port 240 of gyrator 215, and $I_Y$ is the current into and $V_Y$ is the voltage across the two terminals constituting a second port 245 of gyrator 215. Transfer transconductances $g_{m1}$ and $g_{m2}$ determine the gyration constant of gyrator 215 and in one embodiment are substantially equal. Gyrator 215 receives its name from the fact that it "gyrates" an input voltage into an output current and vice versa as can be seen from equations (1) and (2) above.

To prevent the strong, outbound signals produced by PA 225 from saturating the input of LNA 220, gyrator 215 is configured to maintain the component of the voltage $V_X$, contributed by PA 225, at 0 volts. In other words, assuming no signal is being received, the voltage $V_X$ is maintained by gyrator 215 to be substantially 0 volts during transmission, thereby isolating the output of PA 225 from the input of LNA 220. The exact mechanism of isolation, provided by gyrator 215, will be described further below in regard to FIGS. 4 and 5.

FIG. 3 illustrates a schematic diagram of gyrator 215, according to embodiments of the present invention. It should be noted that the schematic diagram of gyrator 215 illustrated in FIG. 3 is for illustration purposes only and gyrator 215 is in no way limited thereto.

Gyrator 215 includes two active elements: transistors M1 and M2 that each have a source, drain, and gate node. The source and drain nodes of transistor M1 are respectively coupled to the terminals of first port 240 of gyrator 215, and the source and drain nodes of transistor M2 are respectively coupled to the terminals of second port 245. In an embodiment, the respective sources of transistors M1 and M2 are further coupled to a ground potential, as illustrated in FIG. 3.

During operation, transistors M1 and M2 operate in saturation and essentially form two, common-source amplifiers that receive a control voltage at their respective gates and provide a drain-to-source current proportional thereto. Specifically, transistor M1 is coupled to voltage $V_Y$ at its gate and provides a drain-to-source current $I_X$ that is approximately given by:

$$I_X = V_Y g_{m1} \quad (3)$$

where $g_{m1}$ is the transconductance of transistor M1. Transistor M2 is coupled to voltage $V_X$ through an inverting amplifier 300 and provides a drain-to-source current $I_Y$ that is approximately given by:

$$I_Y = V_X(-g_{m2}) \quad (4)$$

where $g_{m2}$ is the transconductance of transistor M2. The inversion of the transconductance of transistor M2, as noted in equation (4), is provided by inverting amplifier 300. In an embodiment, inverting amplifier 300 is implemented as a common-source amplifier with unity gain.

By reordering equations (3) and (4) and solving for $V_Y$ and $V_X$, it can be shown that the circuit implementation of gyrator 215 satisfies equations (1) and (2) noted above and thereby produces gyrator action. The exact mechanism of isolation, provided by gyrator 215 during transmission will now be described further below in regard to FIG. 4.

2.2 Transmission

The principle of superposition, as applied to circuits, generally refers to the fact that the net response at any given node in a circuit due to two or more independent sources is the sum of the responses caused by each of the independent sources individually. In RF front-end 200, there are effectively two independent sources: antenna 205 and PA 225. Antenna 205 effectively behaves as an independent voltage source during reception of an inbound signal, and PA 225 effectively behaves as an independent voltage source during transmission of an outbound signal.

In FIG. 4, the principle of superposition is used to analyze the response of RF front-end 200 during transmission of a signal (independent from the response caused by the reception of a signal) to describe the method of isolation provided by gyrator 215. FIG. 4 specifically illustrates an equivalent circuit model 400 for RF front-end 200 that includes an independent voltage source ($V_{PA}$) 405, resistor ($R_{PA}$) 410, resistor ($R_{ANT}$) 415, resistor ($R_{LNA}$) 420, and dependent current sources 425 and 430, which are included in gyrator 215.

Independent voltage source 405 is representative of the voltage provided by PA 215 during transmission. $R_{PA}$ 410 represents the output resistance of PA 215, $R_{ANT}$ 415 represents the resistance of the antenna 205 as seen from the secondary winding 235 in FIG. 2, and $R_{LNA}$ 420 represents the input resistance of LNA 220. Dependent current source 425 represents transistor M and dependent current source 430 represents transistor M2. Dependent currents sources 425 and 430 are defined by equations (3) and (4) noted above and reproduced below:

$$I_X = V_Y g_{m1} \quad (3)$$

$$I_Y = V_X(-g_{m2}) \quad (4)$$

where $g_{m1}$ is the transconductance of transistor M1 and $g_{m2}$ is the transconductance of transistor M2.

By design, resistors 410, 415, and 420 each have substantially equal resistances (typically 50 ohms) in order to maximize power transfer and minimize reflections. In addition, by design the reciprocal of the transconductances of transistors M1 and M2 (i.e., $1/g_{m1}$ and $1/g_{m2}$) are further substantially equal to the resistance of resistors 410, 415, and 420.

Given these design assumptions, in order for isolation to exist between the input of LNA 220 and the output of PA 225, the voltage $V_X$ should be maintained at 0 volts during transmission. If $V_X$ is 0 volts during transmission, then dependent current source 430 behaves as an open circuit and supplies 0 amps of current as determined by equation (4) above. Therefore, the entire power amplifier current $I_{PA}$, as illustrated in FIG. 4, flows through $R_{ANT}$ 415. In order for $V_X$ to be maintained at zero volts, the current $I_X$ provided by dependent current source 425 should balance (or be equal) to the current $I_{PA}$ flowing through $R_{ANT}$ 415. The current $I_{PA}$ is given by:

$$I_{PA} = \frac{V_Y - V_X}{R_{ANT}} = \frac{V_Y - 0}{R_{ANT}} = \frac{V_Y}{R_{ANT}} \quad (5)$$

To verify that the current $I_X$ provided by dependent current source 425 is equal to the current $I_{PA}$, equation (5) can be set equal to equation (3) above. If the resulting equation holds true (or is valid) then $V_X$ is 0 volts and isolation has in fact been achieved:

$$I_{PA} = \frac{V_Y}{R_{ANT}} = V_Y \cdot g_{m1} = I_X \quad (6)$$

Because $g_{m1}$ by design is equal to $1/R_{ANT}$, the above equation holds true so that the input of LNA 225 is isolated from the output of PA 220 during transmission.

2.3 Reception

In FIG. 5, the principle of superposition is further used to analyze the response of RF front-end 200 during reception of a signal (independent from the response caused by the transmission of a signal). Specifically, FIG. 5 further illustrates that gyrator 215 further isolates the output of PA 225 from the input of LNA 220 during reception.

FIG. 5 illustrates an equivalent circuit model 500 for RF front-end 200 that includes an independent voltage source ($V_{ANT}$) 535, resistor ($R_{PA}$) 510, resistor ($R_{ANT}$) 515, resistor ($R_{LNA}$) 520, and dependent current sources 525 and 530, which are included in gyrator 215. Independent voltage source 535 is representative of the voltage provided by antenna 205 during reception. $R_{PA}$ 510 represents the output resistance of PA 215, $R_{ANT}$ 515 represents the resistance of the antenna 205 as seen from the secondary winding 235 in FIG. 2, and $R_{LNA}$ 520 represents the input resistance of LNA 220. Dependent current source 525 represents transistor M1 and dependent current source 530 represents transistor M2. Dependent current sources 525 and 530 are defined by equations (3) and (4) noted above and reproduced below:

$$I_X = V_Y g_{m1} \quad (3)$$

$$I_Y = V_X(-g_{m2}) \quad (4)$$

where $g_{m1}$ is the transconductance of transistor M1 and $g_{m2}$ is the transconductance of transistor M2.

By design, resistors 510, 515, and 520 each have substantially equal resistances (typically 50 ohms) in order to maximize power transfer and minimize reflections. In addition, by design the reciprocal of the transconductances of transistors M1 and M2 (i.e., $1/g_{m1}$ and $1/g_{m2}$) are further substantially equal to the resistance of resistors 510, 515, and 520.

Given these design assumptions, in order for isolation to exist between the input of LNA 220 and the output of PA 225, the voltage $V_Y$ should be maintained at 0 volts during reception. If $V_Y$ is 0 volts during reception, then dependent current source 525 behaves as an open circuit and supplies 0 amps of current as determined by equation (3) above. Therefore, the entire antenna current $I_{ANT}$, as illustrated in FIG. 4, flows through $R_{LNA}$ 515. In order for $V_Y$ to be maintained at zero volts, the current $I_Y$ provided by dependent current source 530 should balance (or be equal) to the current $I_{ANT}$ flowing through $R_{ANT}$ 515. The current $I_{ANT}$ is given by:

$$I_{ANT} = \frac{V_Y - V_X}{R_{ANT}} = \frac{0 - V_X}{R_{ANT}} = \frac{-V_X}{R_{ANT}} \quad (7)$$

To verify that the current $I_Y$ provided by dependent current source 530 is equal to the current $I_{ANT}$, equation (7) can be set equal to equation (4) above. If the resulting equation holds true (or is valid) then $V_Y$ is 0 volts and isolation has in fact been achieved:

$$I_{ANT} = \frac{-V_X}{R_{ANT}} = V_X \cdot (-g_{m2}) = I_Y \quad (8)$$

Because $g_{m2}$ by design is equal to $1/R_{ANT}$, the above equation holds true so that the input of LNA 225 is isolated from the output of PA 220 during reception.

3. CONCLUSION

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A gyrator-based duplexer comprising:
   a first transistor comprising a source, a drain coupled to a first port, and a gate coupled to a second port; and
   a second transistor comprising a source, a drain coupled to the second port, and a gate coupled to the first port,
   wherein the first transistor electrically isolates the first port from the second port by providing a drain-to-source current based on a voltage across the second port.

2. The gyrator-based duplexer of claim 1, wherein an input impedance of the first port is substantially equal to a reciprocal of a transconductance of the first transistor.

3. The gyrator-based duplexer of claim 1, wherein an input impedance of the second port is substantially equal to a reciprocal of a negative transconductance of the second transistor.

4. The gyrator-based duplexer of claim 1, wherein the first transistor and the second transistor are metal oxide semiconductor field effect transistors (MOSFETs).

5. The gyrator-based duplexer of claim 4, wherein the first transistor and the second transistor are n-channel type MOSFETs.

6. A gyrator-based duplexer comprising:
   a first transistor comprising a source, a drain coupled to a first port, and a gate coupled to a second port;
   a second transistor comprising a source, a drain coupled to the second port, and a gate coupled to the first port; and
   a transformer comprising a primary winding and a secondary winding coupled between the first port and the second port.

7. The gyrator-based duplexer of claim 6, wherein the first port is electrically isolated from the second port.

8. The gyrator-based duplexer of claim 6, further comprising:
   an inverting amplifier coupled between the first port and the gate of the second transistor.

9. The gyrator-based duplexer of claim 8, wherein an input impedance of the first port is substantially equal to a reciprocal of a transconductance of the first transistor.

10. The gyrator-based duplexer of claim 9, wherein an input impedance of the second port is substantially equal to a reciprocal of a negative transconductance of the second transistor.

11. The gyrator-based duplexer of claim 6, wherein the first transistor and the second transistor are metal oxide semiconductor field effect transistors (MOSFETs).

12. The gyrator-based duplexer of claim 11, wherein the first transistor and the second transistor are n-channel type MOSFETs.

13. A gyrator-based duplexer comprising:
   a first transistor comprising a source, a drain coupled to a first port, and a gate coupled to a second port; and
   a second transistor comprising a source, a drain coupled to the second port, and a gate coupled to the first port; and
   an inverting amplifier coupled between the first port and the gate of the second transistor,
   wherein the second transistor electrically isolates the second port from the first port by providing a drain-tosource current based on a voltage at the gate of the second transistor provided by the inverting amplifier.

14. The gyrator-based duplexer of claim 13, wherein the first port is electrically isolated from the second port.

15. The gyrator-based duplexer of claim 13, wherein an input impedance of the first port is substantially equal to a reciprocal of a transconductance of the first transistor.

16. The gyrator-based duplexer of claim 15, wherein an input impedance of the second port is substantially equal to a reciprocal of a negative transconductance of the second transistor.

17. The gyrator-based duplexer of claim 13, wherein the first transistor and the second transistor are metal oxide semiconductor field effect transistors (MOSFETs).

18. The gyrator-based duplexer of claim 17, wherein the first transistor and the second transistor are n-channel type MOSFETs.

19. The gyrator-based duplexer of claim 13, wherein the source of the first transistor is coupled to ground and the source of the second transistor is coupled to ground.

20. The gyrator-based duplexer of claim 13, wherein the first transistor electrically isolates the first port from the second port by providing a second drain-to-source current based on a voltage across the second port.

* * * * *